United States Patent
Shin et al.

(10) Patent No.: US 7,224,519 B2
(45) Date of Patent: May 29, 2007

(54) LOW NOISE MULTI-WAVELENGTH LIGHT SOURCE AND WAVELENGTH DIVISION MULTIPLEXING SYSTEM USING SAME

(75) Inventors: Hyun-Cheol Shin, Suwon-si (KR); Jeong-Seok Lee, Anyang-si (KR); Seong-Taek Hwang, Pyeongtaek-si (KR); Dae-Kwang Jung, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 134 days.

(21) Appl. No.: 10/798,662

(22) Filed: Mar. 11, 2004

(65) Prior Publication Data
US 2005/0047727 A1 Mar. 3, 2005

(30) Foreign Application Priority Data
Aug. 29, 2003 (KR) ............... 10-2003-0060191

(51) Int. Cl.
*H01S 5/50* (2006.01)
*H04J 14/02* (2006.01)
(52) U.S. Cl. ............... 359/344; 398/71; 372/50.22
(58) Field of Classification Search ........ 398/72, 398/183, 71; 372/50.22, 50.121; 359/344
See application file for complete search history.

(56) References Cited

U.S. PATENT DOCUMENTS

| | | | | |
|---|---|---|---|---|
| 3,484,713 A * | 12/1969 | Fenner | .............. | 372/44.01 |
| 3,504,302 A * | 3/1970 | Fenner | .............. | 372/28 |
| 4,957,339 A * | 9/1990 | Fussganger et al. | ......... | 398/82 |
| 5,103,456 A * | 4/1992 | Scifres et al. | ............ | 372/50.22 |
| 5,202,780 A * | 4/1993 | Fussanger | .............. | 398/72 |
| 5,260,960 A * | 11/1993 | Amann et al. | ......... | 372/46.014 |
| 5,371,757 A * | 12/1994 | Largent | .............. | 372/50.22 |

(Continued)

FOREIGN PATENT DOCUMENTS

JP 62-199086 9/1987

(Continued)

OTHER PUBLICATIONS

Lasing threshold. Wikipedia, the free encyclopedia. Multiple Editors/Authors. Uploaded: Dec. 6, 2005. Downloaded: Jan. 11, 2006. http://en.wikipedia.org/w/index.php?title=Lasing_threshold &oldid=30321671.*

(Continued)

*Primary Examiner*—Jack Keith
*Assistant Examiner*—Ari M Diacou
(74) *Attorney, Agent, or Firm*—Cha & Reiter, LLC

(57) ABSTRACT

A multi-wavelength light source includes a substrate, a fabry-perot laser laminated on the substrate that is operated by driving current below a predetermined threshold current to generate multi-wavelength light including a plurality of peaks whose wavelengths and spacing are identical to those of WDM channels. A semiconductor optical amplifier (SOA) is laminated on the substrate in an arrangement such that a slant surface of the SOA is opposed to a side surface of the fabry-perot laser, which serves to thereby amplify the multi-wavelength light output from the fabry-perot laser. The semiconductor optical amplifier is driven in a gain saturation state to reduce the relative intensity of noise in the channels of the multi-wavelength light that are simultaneously amplified.

11 Claims, 7 Drawing Sheets

U.S. PATENT DOCUMENTS

| | | | |
|---|---|---|---|
| 5,394,261 A * | 2/1995 | Nakamura | 398/182 |
| 5,517,232 A * | 5/1996 | Heidemann et al. | 725/98 |
| 5,550,666 A * | 8/1996 | Zirngibl | 398/72 |
| 5,568,311 A * | 10/1996 | Matsumoto | 359/344 |
| 5,790,580 A * | 8/1998 | Sakata et al. | 372/50.121 |
| 5,808,764 A * | 9/1998 | Frigo et al. | 398/72 |
| 5,808,767 A * | 9/1998 | Williams et al. | 398/70 |
| 5,864,413 A * | 1/1999 | Feldman et al. | 398/72 |
| 5,864,415 A * | 1/1999 | Williams et al. | 398/72 |
| 5,914,978 A * | 6/1999 | Welch et al. | 372/50.22 |
| 5,926,297 A * | 7/1999 | Ishikawa et al. | 398/43 |
| 6,141,477 A * | 10/2000 | Kitamura | 385/131 |
| RE37,051 E * | 2/2001 | Welch et al. | 372/50.22 |
| 2001/0015836 A1* | 8/2001 | Kim et al. | 359/124 |
| 2001/0015839 A1* | 8/2001 | Koh et al. | 359/128 |
| 2001/0030785 A1* | 10/2001 | Pangrac et al. | 359/125 |
| 2001/0055138 A1* | 12/2001 | Richardson et al. | 359/173 |
| 2002/0080454 A1* | 6/2002 | Schemmann et al. | 359/181 |
| 2002/0154372 A1* | 10/2002 | Chung et al. | 359/182 |
| 2003/0030859 A1* | 2/2003 | Youn et al. | 359/110 |
| 2003/0067676 A1* | 4/2003 | Wang et al. | 359/344 |
| 2003/0210724 A1* | 11/2003 | Ungar | 372/50 |
| 2003/0219054 A1* | 11/2003 | Capasso et al. | 372/50 |
| 2006/0024066 A1* | 2/2006 | Fujiwara et al. | 398/183 |

FOREIGN PATENT DOCUMENTS

| | | |
|---|---|---|
| JP | 03-163891 | 7/1991 |
| JP | 05-206570 | 8/1993 |
| JP | 2002-270949 | 9/2002 |
| JP | 2003-134058 | 5/2003 |
| WO | WO 03/063401 | 7/2003 |

OTHER PUBLICATIONS

Spectral linewidth. Wikipedia, the free encyclopedia. Multiple Editors/Authors. Uploaded: Nov. 2, 2005. Downloaded: Jan. 11, 2006. http://en.wikipedia.org/w/index.php?title=Spectral_linewidth&oldid=27157822.*

* cited by examiner

US 7,224,519 B2

LOW NOISE MULTI-WAVELENGTH LIGHT SOURCE AND WAVELENGTH DIVISION MULTIPLEXING SYSTEM USING SAME

CLAIM OF PRIORITY

This application claims priority to an application entitled "Multi-wavelength light source and wavelength division multiplexing system using the same," filed in the Korean Intellectual Property Office on Aug. 29, 2003 and assigned Serial No. 2003-60191, the contents of which are hereby incorporated by reference.

BACKGROUND OF THE INVENTION

1. Field of the Invention

The present invention relates to light sources that are used for optical communications. More particularly, the present invention relates to a multi-wavelength light source which can output multi-wavelength light in a multiplex system that includes a plurality of channels having differing wavelengths.

2. Description of the Related Art

In wavelength division multiplexed optical communication systems, a plurality of channels having different wavelengths are multiplexed into as a composite optical signal that is transmitted across a transmission medium. The multiplexed optical signal is received and demultiplexed into a plurality of signals having different wavelengths, and each of these demultiplexed signals are detected and grouped as separate channels according to their wavelengths. Accordingly, wavelength division multiplexing methods permit the efficient expansion of optical communication capacity, and allows for data to be transmitted regardless of the transmission data type.

A typical wavelength division multiplexed optical communication system includes a central office and at least one remote node. In order to transmit data to subscribers, the central office multiplexes a plurality of downstream channels having different wavelengths into a downstream optical signal so as to output the multiplexed optical signal. Further, the central office detects upstream channels output from the subscribers. The remote node is located between the subscribers and the central office to relay the central office to each subscriber.

In the wavelength division multiplexing, some of the types of light sources that can be used are a plurality of single-wavelength light sources or an incoherent multi-wavelength light source. Distributed feedback lasers or fabry-perot lasers can be used as the single-wavelength light sources, and an erbium doped fiber amplifier or a light emitting diode (LED) can be used as the incoherent multi-wavelength light source.

Each of the single-wavelength light sources generates only one mode-locked channel so as to have a single wavelength by a laser resonance. Therefore, the single-wavelength light sources are advantageous in long-distance transmissions because they are coherent sources. Also, the channel power loss and occurrences of noise are minimized in the single-wavelength light sources.

However, one drawback of using single-wavelength light sources is that a plurality of single-wavelength light sources must be provided to the system in order to correspond respectively to the number of transmitted channels. This one to one correspondence increases not only the size of the wavelength division multiplexed optical communication system increases, but also the manufacturing costs.

Meanwhile, the multi-wavelength light sources, such as the LED, have been proposed as an alternative for solving the above-mentioned problems of the single-wavelength light sources. However, the multi-wavelength light sources have the problem that they output incoherent light. Therefore, in comparison with the single-wavelength light source, the multi-wavelength light sources are disadvantageous in a long-distance transmission.

In order to overcome the disadvantages of both the multi-wavelength light source and the single-wavelength light source, a fabry-perot laser with EDFA (Erbium Doped Fiber Amplifier) has been proposed for use in a method of generating and amplifying multi-wavelength light including channels having different wavelengths.

However, the fabry-perot laser does not solve all the above-mentioned problems, particularly when used in multi-wavelength light source. The multiple channels output from the laser are subject to power fluctuation that commonly occurs, thereby increasing relative intensity noise.

SUMMARY OF THE INVENTION

Accordingly, the present invention provides a multi-wavelength light source that has both a low relative intensity of noise and a low manufacturing cost.

According to a first aspect of the present invention, there is provided a multi-wavelength light source comprising: a substrate, a fabry-perot laser laminated on the substrate, and driven by driving current below threshold current, thereby generating multi-wavelength light including a plurality of peaks whose wavelengths and spacing are identical to these of WDM channels, and a semiconductor optical amplifier laminated on the substrate in such a manner that a slant surface of the semiconductor optical amplifier is opposed to a side surface of the fabry-perot laser, thereby amplifying the multi-wavelength light outputted from the fabry-perot laser, wherein the semiconductor optical amplifier is operated in a gain saturation state, thereby reducing the relative intensity noise of channels of the multi-wavelength light and simultaneously amplifying the multi-wavelength light.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE INVENTION

Hereinafter, a description of the present invention will be presented with reference to the accompanying drawings. For the purposes of clarity and simplicity, a detailed description of known functions and configuration incorporated herein will be omitted as it may obscure the subject matter of the present invention.

Figure 1:
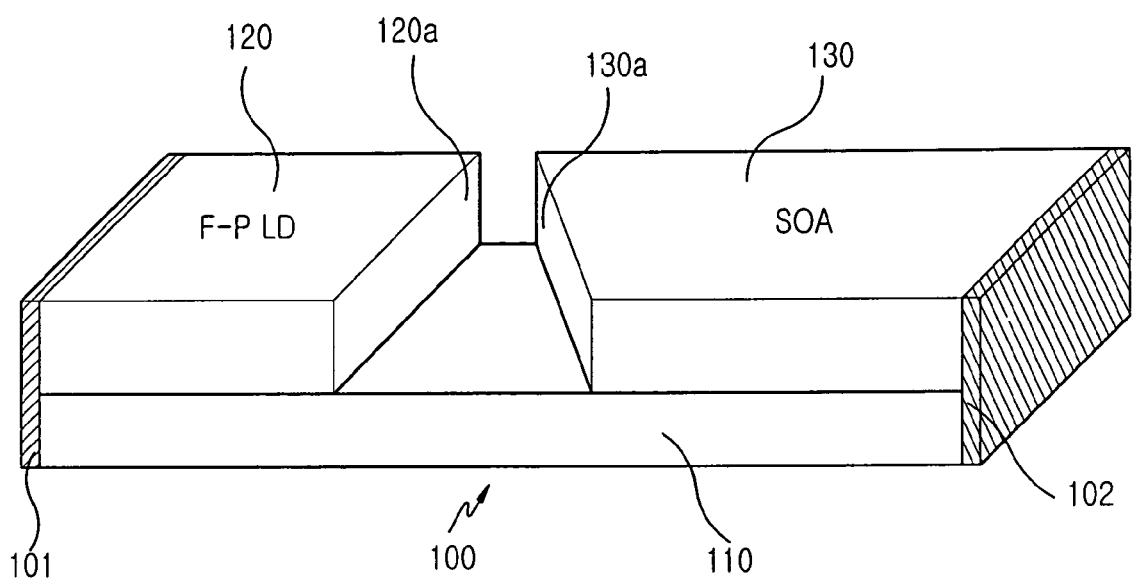
FIG. 1 is a perspective view of a multi-wavelength light source according to a first aspect of the present invention, which includes a fabry-perot laser and a semiconductor optical amplifier integrated on a single-substrate.

FIG. 1 is a perspective view of a multi-wavelength light source according to a first aspect of the present invention, which includes a fabry-perot laser and a semiconductor optical amplifier integrated on a single-substrate. Referring to FIG. 1, the multi-wavelength light source 100 according to the first aspect of the present invention includes a substrate 110, a fabry-perot laser 120 driven by driving current below threshold current, and the semiconductor optical amplifier (hereinafter, referred to as a SOA) 130. The multi-wavelength light source 100 has a high reflection layer 101 coated on a first surface of the multi-wavelength light source 100 including an end surface of the fabry-perot laser 120. Further, the multi-wavelength light source 100 has anti-reflection layers, which are coated on a side surface 120a of the fabry-perot laser 120 opposed to the SOA 130, a slant surface 130a of the SOA 130 opposed to the fabry-perot laser 120, and a second end surface 102 of the multi-wavelength light source 100 including one surface of the SOA 130, respectively.

The fabry-perot laser 120 is laminated on the substrate 110 and is operated by driving current below a predetermined threshold current, thereby causing the output of multi-wavelength light including a plurality of peaks whose wavelengths and spacing are identical to these of WDM channels, The SOA 130 is laminated on the substrate 110 in such a manner that end surfaces 120a and 130a of the fabry-perot laser 120 and the SOA 130 are opposed to each other. The arrangement of the opposing ends of the SOA and the fabry-perot laser permit the amplifying of the multi-wavelength light output from the fabry-perot laser 120.

Figure 2:
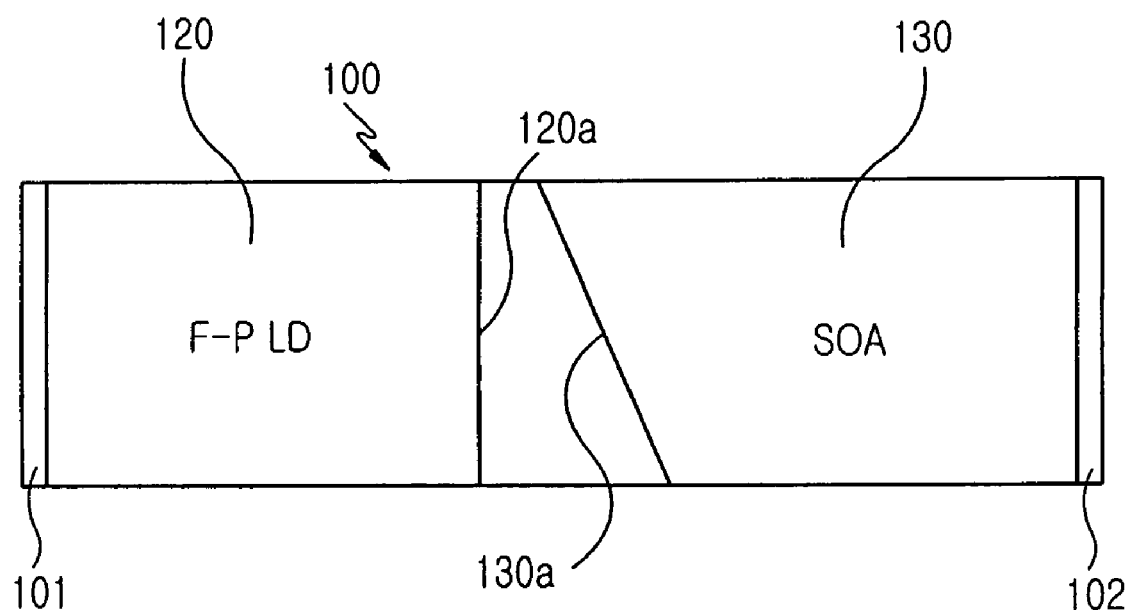
FIG. 2 is a plan view of the multi-wavelength light source shown in FIG. 1.

FIG. 2 is a plan view of the multi-wavelength light source shown in FIG. 1. Referring to FIG. 2, the end surface 130a of the SOA 130 opposed to end surface 120a of the fabry-perot laser 120 is inclined with respect to a predetermined angle, with thereby preventing the multi-wavelength light output from the fabry-perot laser 120 from being reflected from the SOA 130 to the fabry-perot laser 120. Further, a band gap of the SOA 130 is smaller than that of the fabry-perot laser 120, so that a spectrum of the multi-wavelength light output from the fabry-perot laser 120 coincides with a gain spectrum that can be amplified by the SOA 130. The anti-reflection layers are coated on the slant surface 130a of the SOA 130, which is opposed to the fabry-perot laser 120, and the side surface 120a of the fabry-perot laser 120 opposed to the SOA 130.

The peak wavelengths of output channels as well as the intervals between the outputted channels are determined according to the length of the fabry-perot laser 120. Accordingly, when the multi-wavelength light source shown in FIG. 2 is employed in the wavelength division multiplexing system, the length of the fabry-perot laser 120 is adjusted, so that wavelengths of channels and intervals between the channels can be adjusted, which are necessary for the wavelength division multiplexing system.

Figure 3:
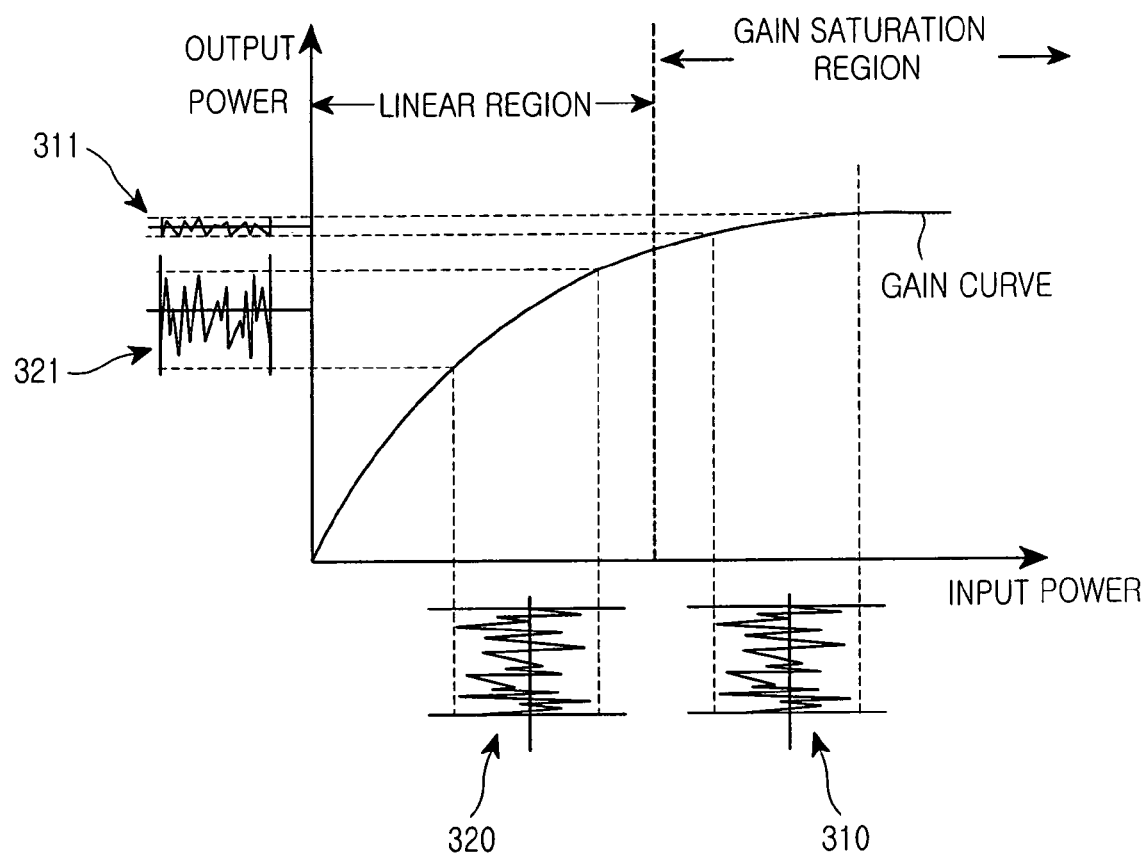
FIG. 3 is a graph of a gain curve showing variation of power of multi-wavelength lights input to and amplified by the semiconductor optical amplifier shown in FIG. 1.
Figure 4:
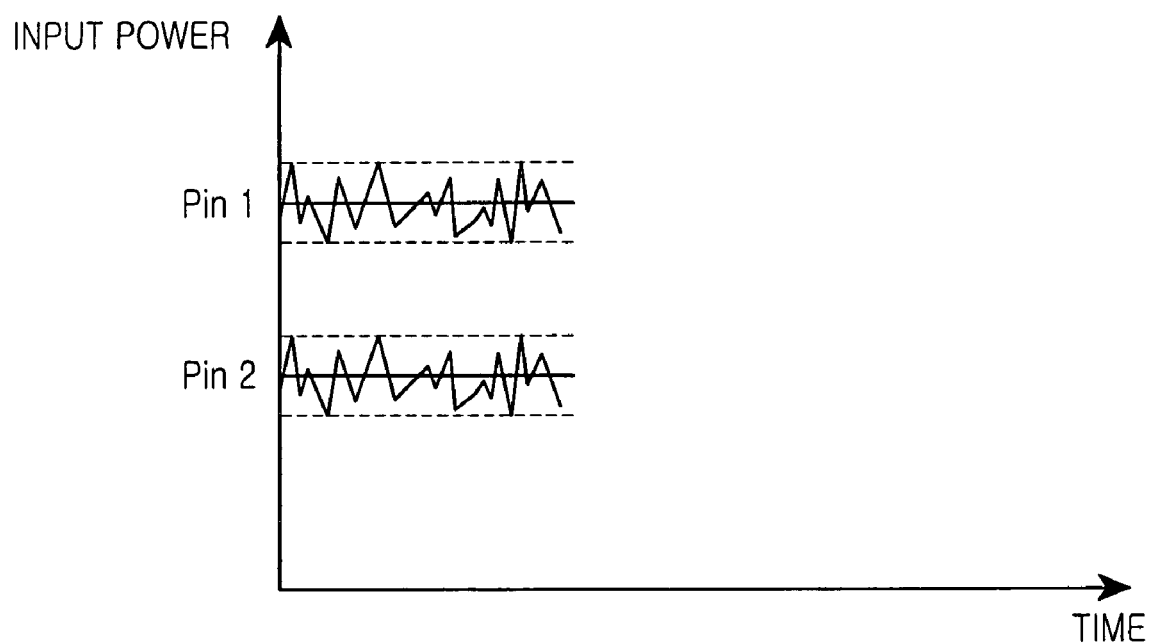
FIG. 4 is a graph showing the power of the multi-wavelength lights shown in FIG. 3 input to the semiconductor optical amplifier.
Figure 5:
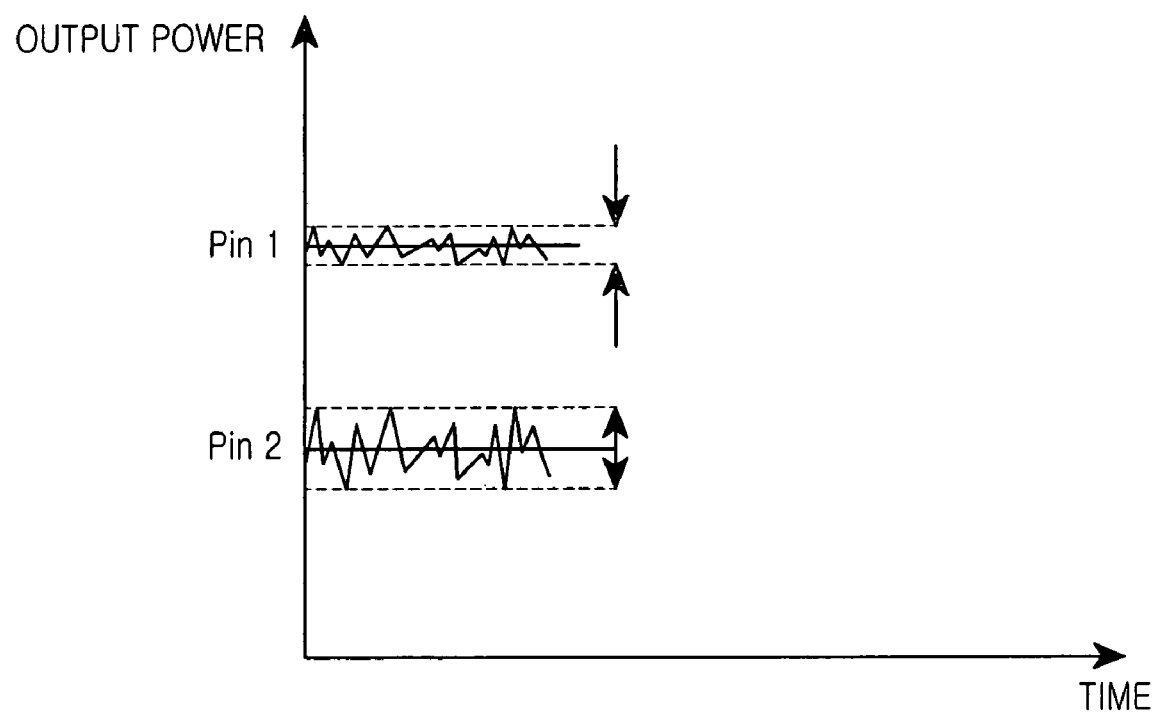
FIG. 5 is a graph showing the power of the multi-wavelength lights shown in FIG. 3 amplified by the semiconductor optical amplifier.

FIG. 3 is a graph of a gain curve showing correlation between the power of multi-wavelength lights input to the SOA shown in FIG. 1, and power of the multi-wavelength lights amplified by the SOA. Further, FIG. 4 shows the power of the multi-wavelength lights inputted to the SOA shown in FIG. 1, and FIG. 5 shows the power of the multi-wavelength lights amplified by the SOA shown in FIG. 1. Hereinafter, an operation characteristic of the multi-wavelength light source shown in FIG. 1 according to the first embodiment of the present invention will be described with reference to FIGS. 3 to 5.

The gain curve of the SOA shown in FIG. 3 shows variation of the power of the multi-wavelength lights 310, 320 input to and amplified by the SOA versus the output values 311, 321, respectively. The graph has a linear region and a gain saturation region. In the linear region, as the power of the multi-wavelength lights input to the SOA increases, the power of the amplified multi-wavelength light output gradually increases. In the gain saturation region, the output power doesn't increase even if the input power is increased gradually. FIG. 4 is a graph showing the power of the multi-wavelength lights 310, 320 input to the SOA 130 shown in FIG. 1. The multi-wavelength lights are output from the fabry-perot laser 120. First multi-wavelength light 310 (which is shown in FIG. 3) has power that corresponds to the gain saturation region of the SOA, which is larger than the power of second multi-wavelength light 320.

Referring back to FIG. 3, the second multi-wavelength light 320 is amplified in the linear region of the SOA instead of the gain saturation region because the second multi-wavelength light has less power than the first multi-wavelength light 310. The first and the second multi-wavelength lights 310 and 320 include a plurality of channels having different wavelengths, and the power of each channel (as shown by pins 1 and 2 in FIG. 4) varies over time. This characteristic is referred to as power fluctuation, and is generally not desirable.

FIG. 5 is a graph showing the output power of the multi-wavelength lights after being amplified by the SOA 130 shown in FIG. 1. Thus, according to FIG. 5, pins 1 and 2 represent the respective output power of multi-wavelength lights 310 and 320 after amplification by the SOA. It can be seen that pin 1 output power, although being larger than that of pin 2, has a lower amount of power fluctuation. As described above, in the linear region of the SOA, the power of the amplified multi-wavelength lights increases in proportion to the power of the input multi-wavelength lights. Therefore, it can be shown from FIG. 5 the different in power fluctuation of the second multi-wavelength light 320 inputted to the SOA versus the first multi-wavelength light 310. Due to the fact that the first multi-wavelength light 310 is input to the gain saturation region (shown in FIG. 3), wherein the output power is almost constant as the input power is varying, the power fluctuation of the multiple channels included in first multi-wavelength light is also reduced.

That is, the power of the multi-wavelength light outputted from the fabry-perot laser 120 shown in FIG. 1 has power included in the gain saturation region of the SOA, so that the power fluctuation of the multi-wavelength light is also reduced. Furthermore, the reduction of the power fluctuation decreases relative intensity noise.

Figure 6:
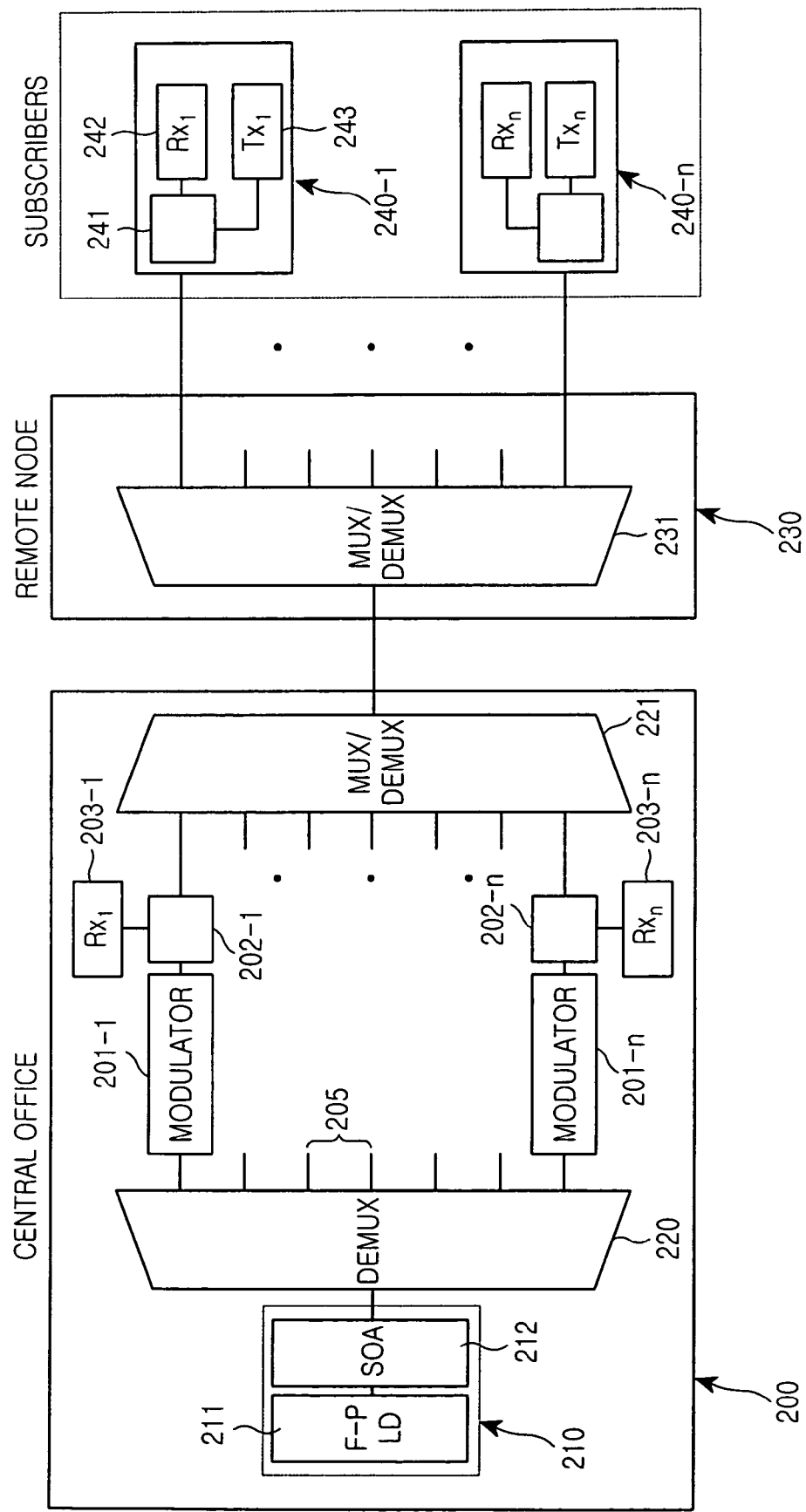
FIG. 6 is a block diagram showing a construction of a wavelength division multiplexing system according to a second aspect of the present invention.

FIG. 6 is a block diagram showing a wavelength division multiplexed communication system including a multi-wavelength light source according to a second embodiment of the present invention. The wavelength division multiplexed communication system includes a central office 200 outputting multi-wavelength light, a remote node 230 connected to the central office 200 through an optical fiber, and a plurality of subscribers 240-1 to 240-$n$ connected to the remote node 230.

The central office 200 includes a light source section 210 for generating multi-wavelength light comprising the fabry-perot laser 211 and the SOA 212, wherein the output of the light source section 211 is demultiplexed by, a demultiplexer 220, a plurality of modulators 201-1 to 201-$n$ for modulating the respective multiplexed signals individually, a plurality of photodetectors 203-1 to 203-$n$ for detecting upstream channels sent by subscribers via the remote node 230 and demultiplexed by a first Mux/Demux 221 and a plurality of wavelength selection couplers 202-1 to 202-$n$.

The light source section 210 includes a laser 211 and a semiconductor optical amplifier (hereinafter, referred to as a SOA) 212. The laser 211 is operated by driving current below a predetermined threshold current so as to generate the multi-wavelength light including a plurality of downstream channels having different wavelengths. The SOA 212 amplifies the multi-wavelength light in a gain saturation state so as to output the amplified light. Therefore, the light source section 210 amplifies the multi-wavelength light while reducing relative intensity noise of the downstream channels of the multi-wavelength light. A fabry-perot laser, etc., can be used as the laser 211, and while preferred, is not required.

The demultiplexer 220 demultiplexes the multi-wavelength light generated by the light source section 210 into a plurality of downstream channels 205 having different wavelengths, and outputs the demultiplexed downstream channels to the modulators 201-1 to 201-$n$. An arrayed waveguide grating, etc., can be used as the demultiplexer 220.

The first multiplexer/demultiplexer 221 demultiplexes an upstream optical signal outputted from the remote node 230 into a plurality of upstream channels having different wavelengths, and outputs the demultiplexed upstream channels to the photodetectors 203-1 to 203-$n$. Further, the first multiplexer/demultiplexer 221 multiplexes the downstream channels modulated by the modulators 201-1~201-$n$ into a downstream optical signal, and outputs the multiplexed optical signal to the remote node 230.

The photodetectors 203-1 to 203-$n$ detect the upstream channels that are demultiplexed by the first multiplexer/demultiplexer 221, and they include light-receiving type active elements such as photo diodes, etc.

The wavelength selection couplers 202-1 to 202-$n$ outputs the downstream channels modulated by the modulators 201-1 to 201-$n$ to the first multiplexer/demultiplexer 221, and outputs the upstream channels, which are output from the first multiplexer/demultiplexer 221, to a corresponding photodetector 203-1 or 203-$n$.

The remote node 230 includes a second multiplexer/demultiplexer 231, so that the remote node 230 multiplexes a plurality of upstream channels having different wavelengths, which are output from the subscribers 240-1 to 240-$n$, into an upstream optical signal, and outputs the multiplexed optical signal to the central office 200. Further, the remote node 230 demultiplexes the downstream optical signal output from the central office 200 into a plurality of downstream channels, and outputs the demultiplexed downstream channels to the subscribers 240-1 to 240-$n$.

Each of the subscribers 240-1 to 240-$n$ includes a photodetector 242, a light source 243, and a wavelength selection coupler 241.

The wavelength selection coupler 241 outputs the downstream channel, which is output from the remote node 230, to the photodetector 242, and outputs an upstream channel generated by the light source 243 to the remote node 230.

The photodetector 242 detects a corresponding downstream channel outputted from the remote node 230, and includes a photo diode, etc.

The light source 243 outputs the upstream channel to the wavelength selection coupler 241, and includes a semiconductor laser, etc.

Figure 7:
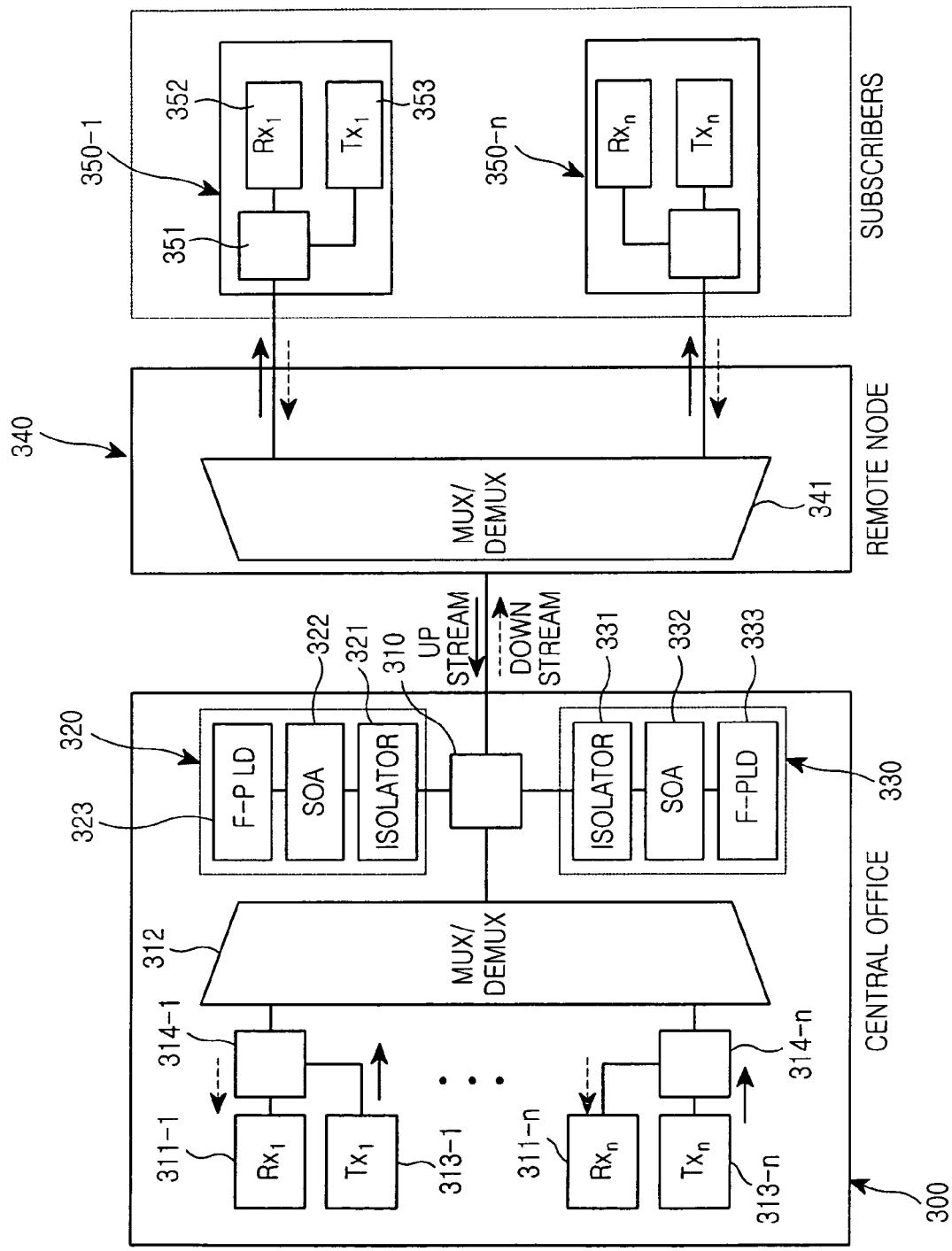
FIG. 7 is a block diagram showing a construction of a wavelength division multiplexing system according to a third aspect of the present invention.

FIG. 7 is a block diagram showing a construction of a wavelength division multiplexing system according to a third aspect of the present invention. Referring to FIG. 7, the wavelength division multiplexing system includes a central office 300 generating a downstream optical signal, a remote node 340 demultiplexing the downstream optical signal into a plurality of downstream channels having different wavelengths, and a plurality of subscribers 350-1 to 350-$n$ connected to the remote node 340.

The central office 300 includes a plurality of light sources 313-1 to 313-$n$ for generating mode-locked downstream channels, a plurality of photodetectors 311-1 to 311-$n$ for detecting upstream channels, a first multiplexer/demultiplexer 312, a downstream broadband light source 330, an upstream broadband light source 320, an optical coupler 310, and wavelength selection couplers 314-1 to 314-$n$.

Each of the light sources 313-1 to 313-$n$ generates mode-locked downstream channels having different wavelengths by corresponding incoherent light.

Each of the photodetectors 311-1 to 311-$n$ detects a corresponding upstream channel outputted from the first multiplexer/demultiplexer 312.

Each of the wavelength selection couplers 314-1 to 314-$n$ outputs incoherent lights, which are outputted from the first multiplexer/demultiplexer 312, to the light sources 313-1 to 313-$n$, and outputs the upstream channels, which are outputted from the first multiplexer/demultiplexer 312, to the photodetectors 311-1 to 311-$n$. Further, each of the wavelength selection couplers 314-1 to 314-$n$ outputs the downstream channels generated by the light sources 313-1 to 313-$n$ to the first multiplexer/demultiplexer 312.

The downstream broadband light source 330 includes a first laser 333 for generating downstream light, a first semiconductor optical amplifier 332, and a first isolator 331, so that the downstream broadband light source 330 enables the light sources 313-1 to 313-$n$ to generate the mode-locked downstream channels.

The first laser 333 can use a fabry-perot laser and is driven by driving current below threshold current, so that the first laser 333 generates downstream light, which includes a plurality of incoherent lights having different wavelengths, for mode-locking the light sources 313-1 to 313-$n$.

The first semiconductor optical amplifier 332 amplifies the downstream light, which is generated by the first laser 333, in a gain saturation state, thereby reducing power fluctuation of the downstream light and relative intensity noise of the downstream light due to the power fluctuation.

The first isolator 331 is connected to the optical coupler 310, so that the first isolator 331 outputs the downstream light, which is amplified by the first semiconductor optical amplifier 332, to the optical coupler 310, and reflects an upstream optical signal, which is outputted from the optical coupler 310, to the optical coupler 310.

The upstream broadband light source 320 includes a second laser 323 for generating upstream light, a second semiconductor optical amplifier 322, and a second isolator 321, and outputs upstream light, which includes a plurality of incoherent lights, for mode-locking the subscribers 350-1 to 350-n.

The second laser 323 can use a fabry-perot laser and is driven by driving current below threshold current, so that the second laser 323 generates upstream light, which includes a plurality of incoherent lights having different wavelengths, for mode-locking the subscribers 350-1 to 350-n.

The first semiconductor optical amplifier 322 amplifies the upstream light, which is generated by the second laser 323, in a gain saturation state, thereby reducing power fluctuation of the upstream light and relative intensity noise of the upstream light due to the power fluctuation.

The second isolator 321 is connected to the optical coupler 310, so that it outputs the upstream light, which is amplified by the second semiconductor optical amplifier 322, to the optical coupler 310, and reflects a downstream optical signal, which is outputted from the optical coupler 310, to the optical coupler 310.

The first multiplexer/demultiplexer 312 demultiplexes the downstream light generated by the downstream broadband light source 330 into a plurality of incoherent lights so as to output the demultiplexed incoherent lights to the wavelength selection couplers 314-1 to 314-n. Further, the first multiplexer/demultiplexer 312 multiplexes the downstream channels generated by the light sources 313-1 to 313-n into a downstream optical signal so as to output the multiplexed optical signal to the optical coupler 310. Furthermore, the first multiplexer/demultiplexer 312 demultiplexes the upstream optical signal outputted from the optical coupler 310 into upstream channels having different wavelengths so as to output the demultiplexed upstream channels to the photodetectors 311-1 to 311-n.

The optical coupler 310 outputs the downstream light and the upstream optical signal to the first multiplexer/demultiplexer 312, and outputs the upstream light and the downstream optical signal to the remote node 340.

The remote node 340 includes a second multiplexer/demultiplexer 341. The multiplexer/demultiplexer 341 demultiplexes the downstream optical signal outputted from the optical coupler 310 into downstream channels having different wavelengths so as to output the demultiplexed downstream channels to the subscribers 350-1 to 350-n. Further, the second multiplexer/demultiplexer 341 multiplexes a plurality of upstream channels having different wavelengths generated by the subscribers 350-1 to 350-n into an upstream optical signal so as to output the multiplexed optical signal to the central office 300. Furthermore, the second multiplexer/demultiplexer 341 demultiplexes the upstream light outputted from the central office 300 into a plurality of incoherent lights having different wavelengths so as to output the demultiplexed incoherent lights to the subscribers 350-1 to 350-n.

Each of the subscribers 350-1 to 350-n includes a light source 353, and a photodetector 352, and a wavelength selection coupler 351. The light source 353 generates a mode-locked upstream channel by corresponding incoherent light, and the photodetector 352 detects a corresponding downstream channel. The wavelength selection coupler 351 outputs the downstream channel, which is outputted from the remote node 340, to the photodetector 352, and outputs the incoherent light to the light source 353. Further, the wavelength selection coupler 351 outputs the mode-locked upstream channel generated by the light source 353 to the remote node 340.

The light source 353 includes a fabry-perot laser, etc., and the photodetector 352 includes a photo diode, etc.

That is, according to the present invention, a fabry-perot laser is driven by driving current below threshold current so as to generate multi-wavelength light including a plurality of channels having different wavelengths. Further, the generated multi-wavelength light is amplified by a semiconductor optical amplifier, which has been driven by high driving current and in a gain saturation state, so as to generate a multi-wavelength light in which a gain of each channel is maintained constant.

According to a multi-wavelength light source of the present invention, multi-wavelength light having a plurality of channels different from each other, which is generated in a fabry-perot laser before a laser resonance, is amplified by a semiconductor optical amplifier in a gain saturation state, so that power fluctuation of each channel is reduced, and thus relative intensity noise is also reduced. Further, a semiconductor optical amplifier and a fabry-perot laser are easily integrated, so that a multi-wavelength light source having a miniaturized size can be manufactured, and the manufacturing cost is reduced.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A multi-wavelength light source comprising:
   a substrate;
   a laser laminated on a first portion of the substrate wherein said laser configured to generate multi-wavelength light including a plurality of channels having different wavelengths when driven by a driving current below a predetermined threshold current; and
   a semiconductor optical amplifier being laminated on a second portion of the substrate and having a first end surface, the first end surface being slanted and opposed to a side surface of the laser,
   wherein the semiconductor optical amplifier is configured to reduce a relative intensity noise in the plurality of channels of the multi-wavelength light and to amplify the multi-wavelength light output from the laser simultaneously, and
   wherein a band gap of the semiconductor optical amplifier is smaller than that of the laser.

2. The multi-wavelength light source as claimed in claim 1, wherein the laser comprises a fabry-perot laser, and the multi-wavelength light source further comprises:
   a high reflection layer coated on a first end surface of the multi-wavelength light source, the first end surface of the multi-wavelength light source including a first end surface of the fabry-perot laser; and
   anti-reflection layers being arranged on a side surface of the fabry-perot laser, the slanted surface of the semiconductor optical amplifier, and a second end surface of the multi-wavelength light source,
   wherein the second end surface of the multi-wavelength light source includes a second end surface of the semiconductor optical amplifier means.

3. The multi-wavelength light source as claimed in claim 1, wherein a spectrum of the multi-wavelength light outputted from the laser coincides with a gain spectrum that is amplified by the semiconductor optical amplifier.

4. The multi-wavelength light source as claimed in claim 1, wherein the slanted surface of the semiconductor optical amplifier opposed to the side surface of the laser is inclined at a predetermined angle with respect to the side surface of the laser.

5. A multi-wavelength light source comprising:
- a fabry-perot laser configured to generate multi-wavelength light including a plurality of peaks having different wavelengths when driven by driving a current below a predetermined threshold current; and
- a semiconductor optical amplifier being coupled to an output of the fabry-perot laser and being configured to amplify the multi-wavelength light outputted from the fabry-perot laser,
- wherein the semiconductor optical amplifier means is configured to reduce a relative intensity of noise in the plurality of channels of the multi-wavelength light and amplify the multi-wavelength light simultaneously, and
- wherein a band gap of the semiconductor optical amplifier is smaller than that of the fabry-perot laser.

6. The multi-wavelength light source as claimed in claim 5, wherein a spectrum of the multi-wavelength light output from the fabry-perot laser coincides with a gain that is amplified by the semiconductor optical amplifier.

7. A wavelength division multiplexing system comprising a central office, a remote node coupled to the central office by an optical fiber, and a plurality of subscribers connected to the remote node, the central office comprising:
- a light source section including a laser and a semiconductor optical amplifier, the laser configured to be driven by driving current below threshold current and configured to generate multi-wavelength light including a plurality of downstream channels having different wavelengths, and
- the semiconductor optical amplifier configured to amplify the multi-wavelength light in a gain saturation state and to output the amplified multi-wavelength light;
- a demultiplexer configured to demultiplex the multi-wavelength light into a plurality of downstream channels having different wavelengths and to output the demultiplexed downstream channels;
- a first multiplexer/demultiplexer configured to demultiplex an upstream optical signal outputted from the remote node into a plurality of upstream channels having different wavelengths and configured to multiplex the downstream channels into a downstream optical signal so as to output the multiplexed optical signal to the remote node; and
- a plurality of photodetectors configured to detect the upstream channels demultiplexed by the first multiplexer/demultiplexer,
- wherein a band gap of the semiconductor optical amplifier is smaller than that of the laser.

8. The multi-wavelength light source as claimed in claim 7, wherein the laser of the light source section includes a fabry-perot laser.

9. The multi-wavelength light source as claimed in claim 7, wherein the central office further comprises:
- a plurality of modulators configured to modulate the downstream channels demodulated by the demultiplexer; and
- a plurality of wavelength selection couplers located between each of the modulators and the first multiplexer/demultiplexer and configured to output the downstream channels that are output from the modulators to the first multiplexer/demultiplexer and to output the upstream channels, which are outputted from the first multiplexer/demultiplexer, to a corresponding photodetector.

10. The multi-wavelength light source as claimed in claim 7, wherein the remote node includes a second multiplexer/demultiplexer configured to multiplex a plurality of upstream channels having different wavelengths, which are output from the subscribers, into an upstream optical signal, to output the multiplexed optical signal to the central office, to demultiplex the downstream optical signal output from the central office into a plurality of downstream channels, and to output the demultiplexed downstream channels to a corresponding subscriber.

11. The multi-wavelength light source as claimed in claim 7, wherein each subscriber comprises:
- a photodetector configured to detect a corresponding downstream channel;
- a light source configured to output the upstream channel to the remote node; and
- a wavelength selection coupler configured to output the downstream channel to the photodetector and to output the upstream channel generated by the light source to the remote node.

* * * * *